(12) United States Patent
Huang et al.

(10) Patent No.: US 6,872,633 B2
(45) Date of Patent: Mar. 29, 2005

(54) DEPOSITION AND SPUTTER ETCH APPROACH TO EXTEND THE GAP FILL CAPABILITY OF HDP CVD PROCESS TO ≦0.10 MICRONS

(75) Inventors: Liu Huang, Singapore (SG); John Sudijono, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/161,014

(22) Filed: May 31, 2002

(65) Prior Publication Data

US 2003/0224580 A1 Dec. 4, 2003

(51) Int. Cl.[7] .............................................. H01L 21/31
(52) U.S. Cl. ...................... 438/435; 438/702; 438/703; 438/763; 438/778
(58) Field of Search ................................ 438/435, 702, 438/763, FOR 227, 703, 778, 960, FOR 388, FOR 395

(56) References Cited

U.S. PATENT DOCUMENTS

| | | | |
|---|---|---|---|
| 5,182,221 A | | 1/1993 | Sato .............................. 437/67 |
| 6,030,881 A | * | 2/2000 | Papasouliotis et al. ....... 438/424 |
| 6,080,639 A | * | 6/2000 | Huang et al. ................ 438/435 |
| 6,261,957 B1 | * | 7/2001 | Jang et al. ................... 438/692 |
| 6,297,128 B1 | | 10/2001 | Kim et al. ................... 438/437 |
| 6,306,722 B1 | | 10/2001 | Yang et al. .................. 438/424 |
| 6,319,796 B1 | * | 11/2001 | Laparra et al. ............. 438/435 |
| 6,323,102 B1 | * | 11/2001 | Horita et al. ................ 438/424 |
| 6,329,261 B1 | * | 12/2001 | Kishimoto .................... 438/359 |
| 6,376,391 B1 | * | 4/2002 | Olson et al. ................. 438/758 |
| 6,410,446 B1 | * | 6/2002 | Tsai et al. .................... 438/695 |
| 6,432,797 B1 | * | 8/2002 | Cha et al. .................... 438/424 |
| 6,531,377 B2 | * | 3/2003 | Knorr et al. ................. 438/435 |

* cited by examiner

*Primary Examiner*—George Fourson
*Assistant Examiner*—Joannie Adelle Garcia
(74) *Attorney, Agent, or Firm*—George O. Saile; Rosemary L. S. Pike

(57) ABSTRACT

A method of filling an STI feature with a dielectric material using a HDP CVD technique is described. By omitting an inert carrier gas like argon in the first CVD step, a small keyhole in a $SiO_2$ layer is formed near the top of the trench. A sputter etch step in the same CVD chamber then removes dielectric material above the keyhole. A second CVD step completely fills the STI trench which is free of voids and forms a layer above the adjacent nitride layer. The nitride layer serves as an etch stop during a CMP step to lower the level of dielectric material until it is coplanar with the nitride layer. The method is low cost since all deposition and sputter etch steps are performed in an existing CVD tool and the same tool is useful in forming trenches of various sizes ranging from below 0.13 micron to above 0.25 micron.

29 Claims, 4 Drawing Sheets

DEPOSITION AND SPUTTER ETCH APPROACH TO EXTEND THE GAP FILL CAPABILITY OF HDP CVD PROCESS TO ≦0.10 MICRONS

FIELD OF THE INVENTION

The present invention relates to a method of fabricating an integrated circuit device. More particularly, the present invention relates to a method of forming shallow trench isolation (STI) structures that are free of pinhole or void defects.

BACKGROUND OF THE INVENTION

Integrated circuits in microelectronic devices are becoming smaller in order to provide higher performance for products requiring advanced technology. The integrated circuits are comprised of several layers which are individually formed with a unique pattern. The pattern is transferred from a reticle or mask into a photoresist layer on a substrate during a lithography process. The pattern is then transferred from the photoresist layer into an underlying substrate usually by means of an etching step. After the photoresist is removed, a pattern remains in the substrate and consists of trenches, via holes, lines, or other features that form pathways for electrical connections within and between layers. Generally, before a new layer can be formed above an existing one, the topography must be planarized to enable a uniform layer of photoresist to be coated on top of it. This can occur by coating a planarizing organic anti-reflective layer before the photoresist film is formed or by using a chemical mechanical polish (CMP) to form a smooth surface on the substrate.

In certain layers, shallow trench isolation (STI) structures are needed to separate areas where active devices are to be formed. The process typically involves forming a trench between areas where active devices will be located, filling the trench in a high density plasma (HDP) chemical vapor deposition (CVD) process with a dielectric material and employing CMP to smooth the surface. Dielectric materials such as silicon dioxide insulate active devices from one another and thereby prevent crosstalk between wiring which would have a detrimental impact on device performance.

The STI structure has been used to fabricate state of the art devices with minimum feature sizes in the range of 130 nm to 250 nm (0.13 to 0.25 microns). As shown in FIG. 1, a shallow trench 20 consists of an opening in an etch stop layer such as silicon nitride layer 12 and extends into an underlying substrate 10. The dimensions of the trench 20 are a width x and a height y that define an aspect ratio of y/x which is usually in the range of about 4.3 to about 5.6. The thickness of the silicon nitride layer 12 is typically from about 1600 Angstroms to about 2000 Angstroms and the height of the shallow trench 20 is generally from about 5600 Angstroms to about 6000 Angstroms. Optionally, there may be a silicon oxide layer between the silicon nitride and the substrate. Once the shallow trench 20 is filled with a dielectric material, it will be useful in isolating active areas from one another. These active areas will be formed in subsequent process steps.

A gap fill process normally involves a high density plasma (HDP) chemical vapor deposition (CVD) of a dielectric material such as silicon dioxide. For example, silane ($SiH_4$) and oxygen can be combined in an HDP CVD process to form silicon dioxide. Referring to FIG. 2, a shallow trench 20 has been previously formed within a silicon nitride layer 12 and a substrate 10. FIG. 2 illustrates a prior art process in which the gas mixture used for the deposition contains argon. As a result of the argon flow, the rate of sputtering is high and sidewall deposition is enhanced which increases the probability of keyhole or void formation in the dielectric layer 14. A keyhole 16 is likely to form near the bottom of the shallow trench 20. If not corrected, the keyhole 16 will remain in the STI structure and cause a loss of performance in the resulting microelectronic device. Therefore, an improved method that avoids keyhole formation in the bottom half of the STI structure and is able to easily remove those formed in the top half of a trench is needed.

Current HDP CVD processes can only completely fill trenches with x >0.17 microns and an aspect ratio <3. Besides feature sizes of 0.13 to 0.18 microns required for current technologies in manufacturing, new devices that will reach manufacturing in the near future need trench widths with dimensions of 0.10 micron or smaller. In the case of STI features, as the width x of the trench becomes ≦0.13 micron, the aspect ratio may increase in some applications to ≧4.3. This specification will make the fabrication of STI structures especially difficult because of a high probability of forming voids or pinhole defects within the dielectric material as it is deposited.

Because of the increasing cost of manufacturing tools including those containing HDP CVD chambers and plasma etch chambers, it is imperative that the number of processing steps be minimized when fabricating a device. A simpler process translates into reduced cost per device and a more attractively priced product in the marketplace. It is also desirable to extend the lifetime of existing equipment to the manufacture of new generations of technology. While HDP CVD tools have been developed with a new design that may be capable of generating STI structures with gap spaces of ≦0.13 micron width and aspect ratio of ≧4.3, implementing them in a production line would have a significant impact in driving up the cost of the product.

Some of the STI trenches are densely packed where the distance between trenches is approximately the same as the width of the trench itself. Other trenches are essentially isolated and have no adjacent trenches within about 1 micron. When densely packed and isolated trenches occur on the same layer, it is desirable to be able to perform the HDP CVD and etch steps so that all STI trenches are filled simultaneously and completely.

The deposition of the dielectric material to fill the trench occurs at high temperature and may result in stress within the structure in addition to the voids or pinhole defects. Several methods to overcome these problems exist in the prior art. U.S. Pat. No. 6,306,722 describes a method to dope the silicon dioxide dielectric fill material which allows the deposition temperature to be reduced and thereby relieve stress in the structure. However, this method does not claim applicability to features as small as 0.13 micron with high aspect ratios or address the problem of pinhole formation within the trench. U.S. Pat. No. 6,261,957 mentions the use of a sputter etch method to help planarize the dielectric material above the trench prior to the CMP process but does not address a solution to the void formation problem during the deposition itself. U.S. Pat. No. 6,297,128 describes a method to alleviate the stress in the dielectric film but requires up to 25 layers to be deposited which would have a large impact on manufacturing cost.

U.S. Pat. No. 5,182,221 describes an electron cyclotron resonance (ECR) CVD process that deposits two types of dielectric material in three steps. However, this method does not mention aspect ratios greater than 3. There is no evidence that it would function as an effective gap fill process for shallow trenches smaller than 0.20 to 0.25 microns. Moreover, ECR CVD tools are not commonly used in manufacturing because of a lower throughput and high cost of ownership.

SUMMARY OF THE INVENTION

An objective of the present invention is to provide a method that is especially useful for filling gaps in shallow trench isolation (STI) structures and which is extendable to the 0.13 micron and 0.10 micron technology nodes and below. Preferably, the method should be applicable to filling any opening or trench with a dielectric material in a high density plasma (HDP) chemical vapor deposition (CVD) tool.

Another objective of the present invention is to provide a method for extending the lifetime of current tools comprising HDP CVD chambers in order to minimize the cost of producing new technologies.

A further objective of the present invention is to provide a method for gap filling in STI structures that does not produce voids within the dielectric material.

A still further objective of the present invention is to provide a method of gap filling STI structures wherein all processes can be performed in one CVD chamber to optimize throughput and minimize cost.

In one embodiment, the present invention is a method for filling an opening or trench in a substrate that is used to fabricate integrated circuits. First, a substrate is provided in which an opening such as a trench has been formed. The top layer of the substrate is preferably an etch stop layer such as silicon nitride. A dielectric material such as $SiO_2$ is deposited by a HDP CVD technique which does not include a gas like argon that has a high sputtering component. The process forms a solid layer with no voids in the bottom half of the trench. In the top half of the trench a small keyhole is formed. The layer of $SiO_2$ extends above the keyhole and over the substrate. A sputter etch is then performed in the same chamber as the previous deposition to remove the top portion of the dielectric layer so that there is no $SiO_2$ over the keyhole which becomes a small trench in the top of the dielectric layer. A second $SiO_2$ deposition similar to the first is performed in the same chamber and forms a layer that completely fills the trench with no voids and extends above the top of the substrate. Finally, a CMP step is used to lower the $SiO_2$ layer until it is coplanar with the etch stop layer on the substrate. This method can fill trenches of varying sizes from below 0.13 microns in width to over 0.25 microns in the same HDP CVD tool.

In another embodiment, the present invention is a method of filling STI features during the fabrication of an integrated circuit in a microelectronics device. The shallow trench is formed in a stack comprised of an etch stop layer such as silicon nitride on a thin pad oxide layer which is on a silicon substrate. A thermal oxide is grown as a liner in the trench prior to the initial deposition of a dielectric material such as $SiO_2$. The HDP CVD process is performed in the absence of a gas like argon which has a high sputtering component. The process forms a solid layer with no voids in the bottom half of the shallow trench. In the top half of the shallow trench a small keyhole is formed. The layer of $SiO_2$ extends above the keyhole and over the substrate. A sputter etch is then performed in the same chamber as the previous deposition to remove the top portion of the dielectric layer so that there is no $SiO_2$ over the keyhole which becomes a small trench in the top of the dielectric layer. A second $SiO_2$ deposition similar to the first is performed in the same chamber and forms a layer that completely fills the shallow trench with no voids and extends above the top of the substrate. Finally, a CMP step is used to lower the $SiO_2$ layer until it is coplanar with the etch stop layer on the substrate. The present invention is particularly useful in that it provides a high throughput, low cost method for gap filling STI structures having trench widths ranging from $\leq 0.13$ micron to greater than 0.25 micron in size. Moreover, the process has the capability to fill dense and isolated shallow trenches simultaneously.

BRIEF DESCRIPTION OF THE DRAWINGS

The drawings are intended to provide a more thorough understanding of the invention. The drawings illustrate embodiments of the invention and together with the description serve to explain the principles of the present invention.

DETAILED DESCRIPTION OF THE INVENTION

The present invention relates to a method of gap filling openings or trenches during the fabrication of an integrated circuit in a microelectronic device. The method is especially useful for filling shallow trench isolation (STI) features but may apply to any process wherein a trench or opening is filled with a dielectric material using a HDP CVD technique. The gap fill process may include a chemical mechanical polish (CMP) step to planarize the dielectric material before the next device layer is formed.

Figure 3:
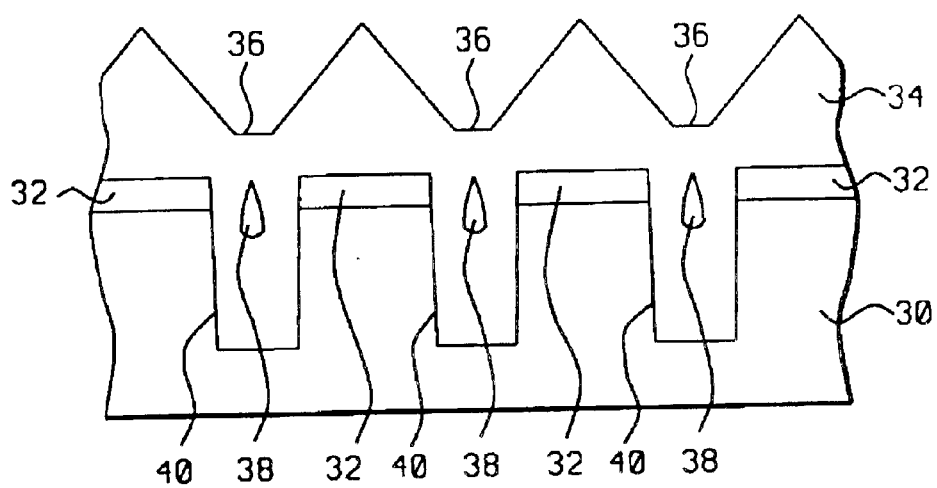
FIG. 3 is a cross section drawing in accordance with an embodiment of the present invention which shows a small keyhole formed near the top of a trench in an initial HDP CVD step that does not include argon in the gas mixture.

In one embodiment of the present invention, a substrate 30 that is typically silicon is provided upon which an etch stop layer 32 is deposited as shown in FIG. 3. Etch stop 32 can be an oxide, an oxynitride or a nitride such as silicon nitride. In this case, silicon nitride layer 32 with a thickness in the range of about 1600 Angstroms to about 2000 Angstroms is used as the etch stop material. A conventional lithography technique involving patterning of a photoresist (not shown) followed by an etch transfer of the pattern through nitride 32 and into substrate 30 is used to form trench 40. Any remaining photoresist after the etch process is removed by a stripping process.

Figure 1:
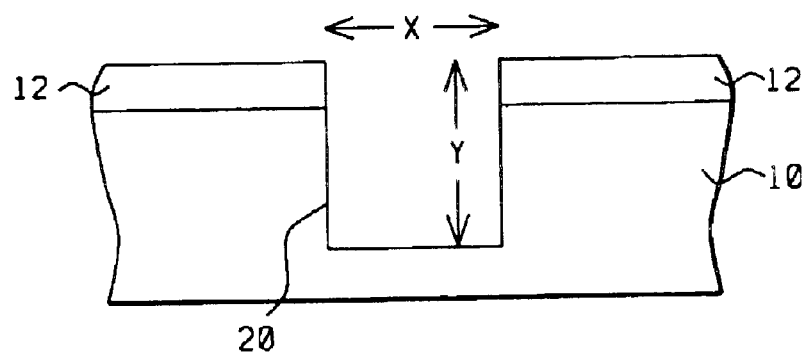
FIG. 1 is a cross sectional drawing of a trench that illustrates the width x and height y that are used to calculate an aspect ratio.
Figure 2:
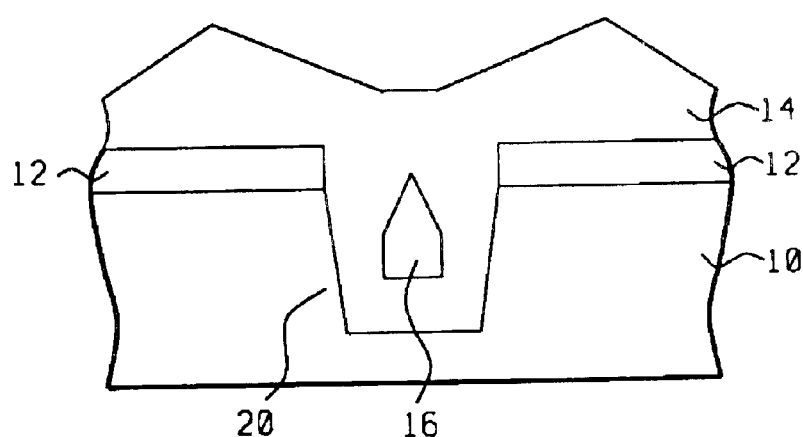
FIG. 2 is cross sectional drawing of a prior art gap fill process that uses argon in the gas mixture during deposition of the dielectric material and forms a keyhole near the bottom of the trench.

Substrate 30 is then placed in an HDP CVD chamber and dielectric layer 34 is deposited in trench 40 and on nitride 32. For example, dielectric layer 34 may be silicon dioxide resulting from a gas mixture containing silane and oxygen. Prior art methods also include argon or an inert carrier gas but the inventors have discovered that omitting argon allows a more controlled deposition wherein the size and location of a keyhole 38 or void can be adjusted. Large keyholes are normally formed in the bottom half of trenches in prior art methods as depicted in FIG. 2 and this leads to a lengthy and costly process of removing them before the gap fill process is completed. By following a process according to the present invention, a smaller keyhole 38 is formed as shown in FIG. 3 and is located in the top half of trench 40 where it is easier to remove than when formed in a lower position.

A key feature is that argon or other inert gases such as helium or neon which are normally included in a CVD deposition are omitted here. The absence of argon causes a lower pressure in the deposition chamber which enhances bottom-up deposition and also reduces redeposition on the sidewall of the trench. Faster bottom-up deposition of dielectric layer 34 and less redeposition on sidewalls avoids keyholes near the bottom of the trench 40. The first deposition is performed such that a small keyhole 38 is fo0rmed in dielectric layer 34 at a distance of about 3000 Angstroms to 5000 Angstroms above the bottom of trench 40. Dielectric layer 34 is also deposited on silicon nitride layer 32 and this uneven layer has a thinnest point 36 directly above trench 40. HDP CVD conditions for depositing a dielectric layer 34 comprised of silicon dioxide are a silane flow rate of 30 standard cubic centimeters per minute (sccm) to 110 sccm, an oxygen flow of 50 sccm to 220 sccm, a temperature of 550° C. to 650° C., a high frequency (HF) RF power of 1500 W to 3500 W, a low frequency (LF) RF power of 1500 W to 7000 W and a pressure of $\leq 3.0$ mTorr.

Figure 4:
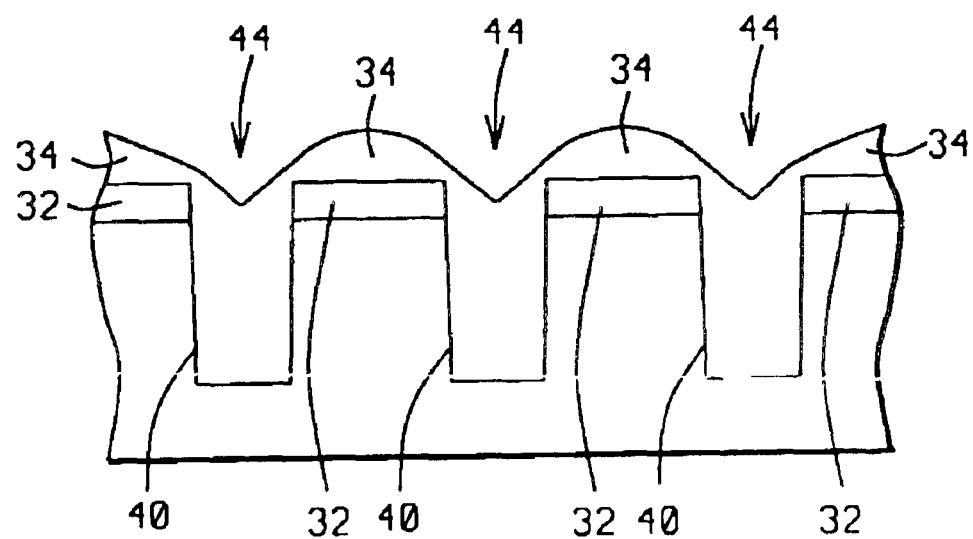
FIG. 4 is a cross sectional drawing after a sputter etch reduces the thickness of the dielectric layer shown in FIG. 3 and removes any material covering the keyhole formed during the initial deposition step.

Next a sputter etch is used to remove the top portion of the dielectric layer 34 such that the material above the keyhole 38 in FIG. 3 is removed to form a small trench 44 in the top portion of dielectric layer 34 in FIG. 4. The sputter etch is preferably performed in the same chamber of the same CVD tool used for the deposition step in order to provide a higher throughput process. In this step an argon or oxygen plasma or argon in combination with oxygen is employed. If argon is used, the HF RF power applied is from 1500 W to 3500 W, the LF RF power is from 1500 W to 7000 W, the pressure is from 2 to 5 mTorr and the argon flow rate is from 70 sccm to 150 sccm for a period of 15 to about 40 seconds. In the case of oxygen plasma, the HF RF power applied is from 1500 W to 3500 W, the LF RF power is from 1500 W to 7000 W, the pressure is from 2 to 5 mTorr and the oxygen flow rate is from 70 sccm to 250 sccm for a period of 15 to about 50 seconds. When a combination of oxygen and argon are used, the HF RF power is from 1500 W to 3500 W, the LR RF power is from 1500 W to 7000 W, the pressure is from 2 to 5 mtorr, argon flow rate is between 50 and 120 sccm and oxygen flow rate is between 50 sccm and 220 sccm.

Figure 5:
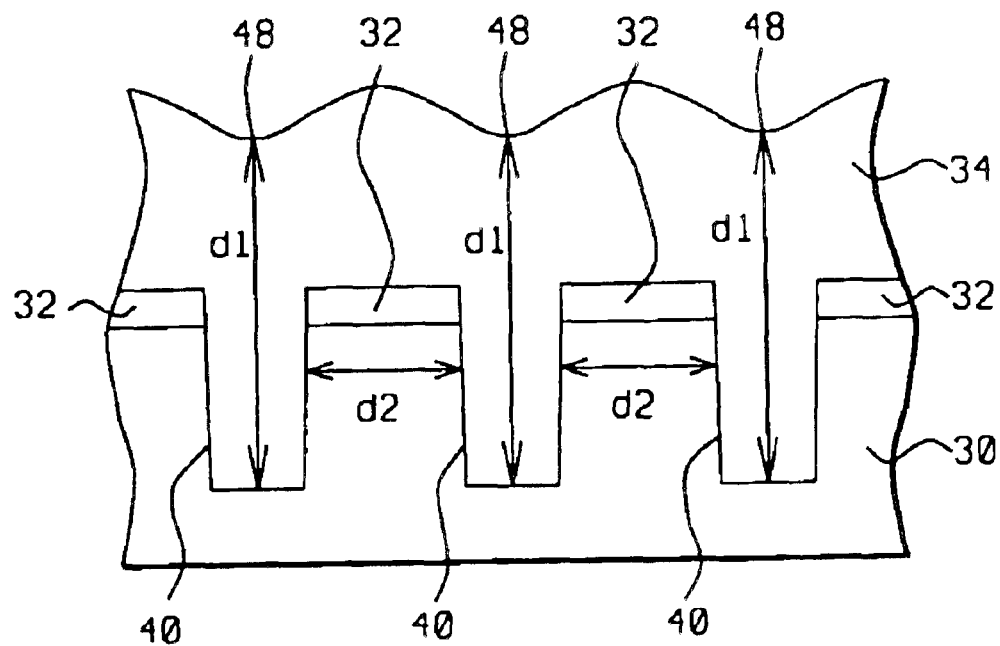
FIG. 5 is a cross sectional drawing after a second HDP CVD step without argon is used to raise the level of the dielectric layer shown in FIG. 4 above the top of the trench without forming any voids.

The HDP CVD process described in the initial deposition step is then repeated to deposit $SiO_2$ so the dielectric layer 34 fills in the small trench 44 shown in FIG. 4 and forms a thickness $d_1$ from the bottom of trench 40 to its thinnest point 48 above the substrate 30 as illustrated in FIG. 5. Typically, a target thickness for dielectric layer 34 of about 6000 to 10000 Angstroms is needed for $d_1$ to ensure that trench 40 is completely filled. The second deposition is performed at a low pressure because of the absence of argon gas and this condition avoids the formation of any further keyholes or pinholes in trench 40.

The width between trenches 40 is shown as $d_2$ and may vary from about 0.1 micron to more than one micron. When the distance $d_2$ is approximately the same as the width of trench 40, the trenches are said to form a dense array. If the distance $d_2$ is about 2× to 10× larger than the width of trench 40, then the trenches are said to form a semi-isolated or isolated array. In many applications, dense and semi-isolated and isolated trenches are formed in the same substrate and must be filled simultaneously with a dielectric layer. An advantage of the present invention is that the trench fill method works equally well for dense and isolated trenches. Therefore, the rate of trench fill in trench 40 is independent of distance $d_2$ and the same process can be applied to fill dense and isolated trenches at the same time without forming voids.

Figure 6:
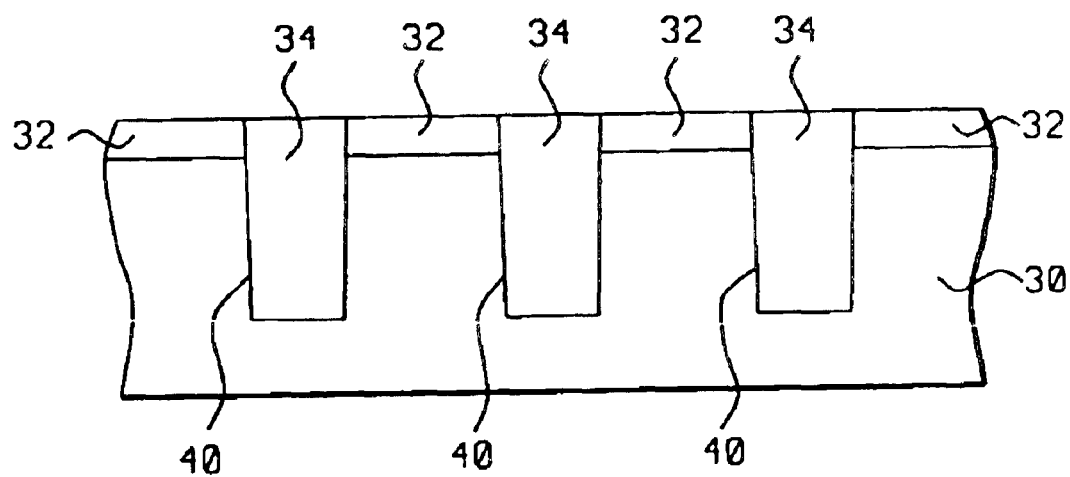
FIG. 6 is a cross sectional view after the gap or trench fill is completed by a chemical mechanical polish (CMP) process.

After the second HDP CVD deposition, a conventional CMP step is used to lower the level of dielectric layer 34. Silicon nitride layer 32 functions as an etch stop and dielectric layer 34 is lowered until it becomes coplanar with the top of silicon nitride layer 32 as shown in FIG. 6. In other words, dielectric layer 34 becomes coplanar with the top of trench 40. The trench fill process is complete at this point. The structure illustrated in FIG. 6 is then ready for further processing to build the next layer in an integrated circuit.

Another advantage of the present invention is that the HDP CVD tool used to perform the deposition and sputter etch in the first embodiment can be used to successfully fill trenches varying in width from below 0.13 micron to above 0.13 micron including trenches for the 0.18 micron and 0.25 micron technology nodes. This flexibility allows a tool set to be used for two or more technologies having significantly different minimum trench sizes and thereby reduces manufacturing cost because implementation of a new tool is avoided.

Figure 7:
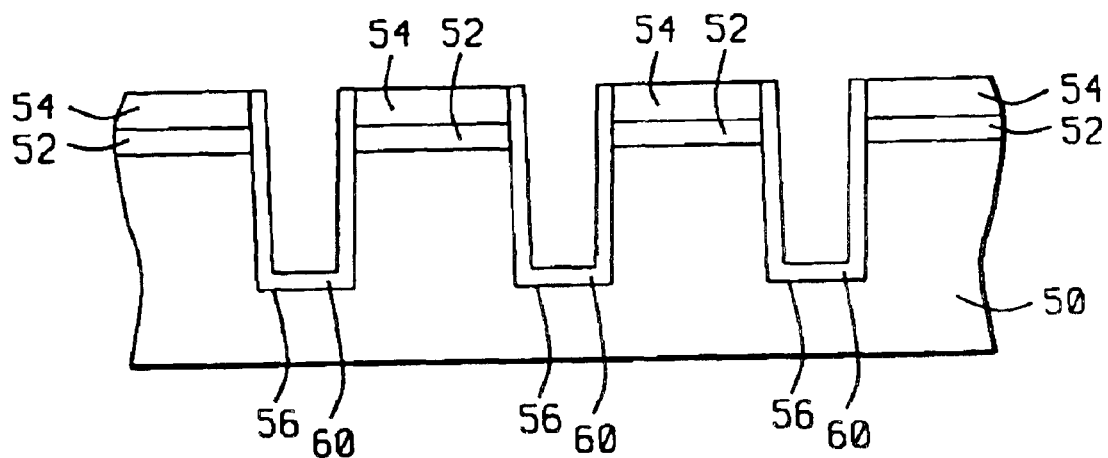
FIGS. 7–10 are cross sectional views of a method for filling STI features according to a second embodiment of the present invention.

In a second embodiment of the present invention, a process is described for filling STI features. A substrate 50 such as silicon is provided upon which a silicon oxide layer 52 is deposited as shown in FIG. 7. The thickness of pad oxide layer 52 is from about 50 to 200 Angstroms. A silicon nitride layer 54 is formed on pad oxide layer 52 and has a thickness in the range of about 1600 to 2000 Angstroms. A conventional lithography technique involving patterning of a photoresist (not shown) followed by standard etch transfer steps through silicon nitride layer 54 and pad oxide layer 52 and into substrate 50 is used to form shallow trench 56. Any remaining photoresist after the etch process is removed by a stripping process. A thin thermal oxide liner 60 with a thickness in the range of about 50 to 250 Angstroms is then grown in the shallow trench 56 in an oxidation furnace and forms a layer of equal thickness on the sidewalls and bottom of shallow trench 56.

Substrate 50 is then placed in an HDP CVD chamber and dielectric layer 64 is deposited in shallow trench 56 and on silicon nitride layer 54. In this case, a gas mixture of silane and oxygen is used to deposit silicon dioxide as dielectric layer 64. A key feature is that argon or other inert gases such as helium or neon which are normally included in a CVD deposition are omitted here. Argon has a high sputtering component which redeposits dielectric material on the sidewalls of shallow trenches and thereby causes keyholes or voids to be formed in the bottom half of a trench as shown in FIG. 2. This leads to a lengthy and costly process of removing them before the gap fill process is completed. By omitting argon, a more controlled deposition is achieved wherein the size and location of a keyhole can be adjusted. By following a process according to the present invention, a smaller keyhole 62 is formed as shown in FIG. 8 and is located in the top half of shallow trench 56 where it is easier to remove than when formed in a lower position.

The absence of argon causes a lower pressure in the deposition chamber which enhances bottom-up deposition and also reduces redeposition on the sidewall of the trench. Faster bottom-up deposition of dielectric layer 64 and less redeposition on sidewalls avoids keyholes near the bottom of the shallow trench 56. The first deposition is performed such that a small keyhole 62 is formed in dielectric layer 64 at a distance of about 3000 Angstroms to 5000 Angstroms above the bottom of shallow trench 56. Dielectric layer 64 is also deposited on silicon nitride layer 54 and forms an uneven layer where the thinnest point is located directly above shallow trench 56. HDP CVD conditions for depositing dielectric layer 64 comprised of silicon dioxide are a silane flow rate of 30 sccm to 110 sccm, an oxygen flow of 50 sccm to 220 sccm, a temperature of 550° C. to 650° C., a high frequency (HF) RF power of 1500 W to 3500 W, a low frequency (LF) RF power of 1500W to 7000 W and a pressure of $\leqq 3.0$ mTorr.

Figure 8:
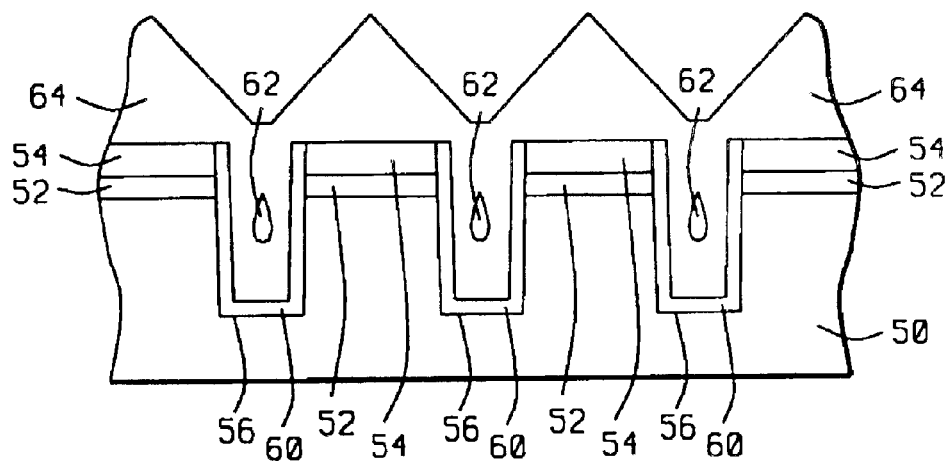
Figure 9:
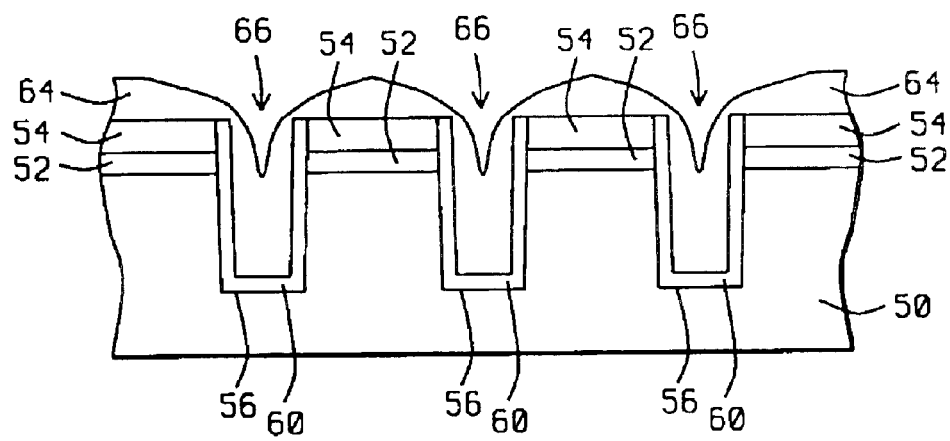

Next a sputter etch is used to remove the top portion of the dielectric layer 64 such that the material above the keyhole 62 in FIG. 8 is removed to form a small trench 66 in the top portion of dielectric layer 64 in FIG. 9. The sputter etch is preferably performed in the same chamber of the same CVD tool used for the deposition step in order to provide a higher throughput process. In this step an argon or oxygen plasma or argon in combination with oxygen is employed. If argon is used, the HF RF power applied is from 1500 W to 3500 W, the LF RF power is from 1500 W to 7000 W, the pressure is from 2 to 5 mtorr and the argon flow rate is from 70 sccm to 150 sccm for a period of 15 to about 40 seconds. In the case of oxygen plasma, the HF RF power applied is from 1500 W to 3500 W, the LF RF power is from 1500 W to 7000 W, the pressure is from 2 to 5 mTorr and the oxygen flow rate is from 70 sccm to 250 sccm for a period of 15 to about 50 seconds. When a combination of oxygen and argon are used, the HF RF power is from 1500 W to 3500 W, the LR RF power is from 1500 W to 7000 W, the pressure is from 2 to 5 mTorr, argon flow rate is between 50 and 120 sccm and oxygen flow rate is between 50 sccm and 220 sccm.

The HDP CVD process described in the initial deposition step is repeated to deposit $SiO_2$, so the dielectric layer 64 fills in the trench 66 shown in FIG. 9 and forms a thick layer whose thinnest point is above the level of silicon nitride layer 54. Typically, a target thickness for dielectric layer 64 of about 6000 Angstroms to about 10000 Angstroms above the bottom of shallow trench 56 is needed to ensure that shallow trench 56 is completely filled to a level above silicon nitride layer 54. The deposition is performed at a low pressure because of the absence of argon gas and this condition avoids the formation of any further keyholes or pinholes in shallow trench 56.

The width between shallow trenches 56 may vary from about 0.1 micron to more than one micron. When the distance between adjacent shallow trenches 56 is approximately the same as the width of a shallow trench 56, the shallow trenches 56 are said to form a dense array. If the distance between adjacent shallow trenches 56 is about 2× to 10× larger than the width of a shallow trench 56, then the shallow trenches 56 are said to form a semi-isolated or isolated array. In many applications, dense and semi-isolated and isolated shallow trenches are formed in the same substrate and must be filled simultaneously with a dielectric layer. An advantage of the present invention is that the gap fill method works equally well for dense and isolated shallow trenches. Therefore, the rate of gap fill in shallow trench 56 is independent of the distance between adjacent shallow trenches 56 and the same process can be applied to fill dense and isolated shallow trenches at the same time without forming voids.

Figure 10:
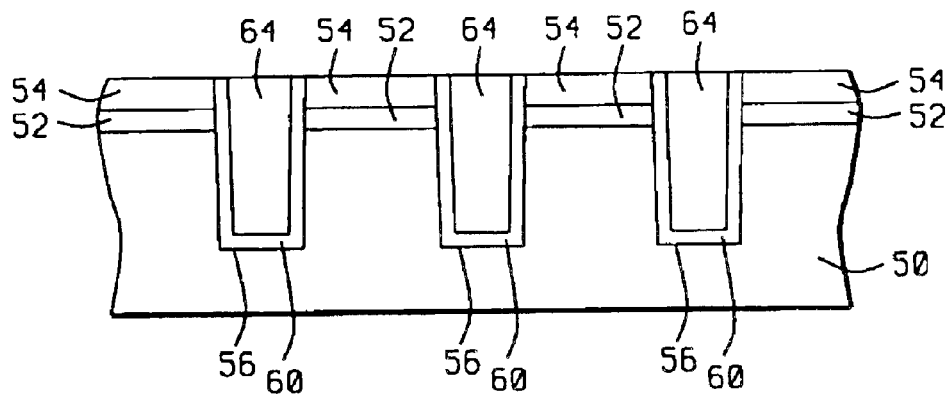

After the second HDP CVD deposition, a conventional CMP step is used to lower the level of dielectric layer 64. Silicon nitride layer 54 functions as an etch stop and dielectric layer 64 is lowered until it becomes coplanar with the top of silicon nitride layer 54 as shown in FIG. 10. In other words, dielectric layer 64 becomes coplanar with the too of shallow trench 56. The gap till process is complete at this point. The STI structure illustrated in FIG. 10 is then ready for further processing such as formation of a gate electrode above silicon nitride layer 54 as the next step in building an integrated circuit.

Another advantage of the present invention is that the HDP CVD tool used to perform the depositions and sputter etch can be used to successfully fill gaps varying in width from below 0.13 micron to above 0.13 micron including trenches for the 0.18 micron and 0.25 micron technology nodes. This flexibility allows a tool set to be used for two or more technologies having significantly different minimum trench sizes and thereby reduces manufacturing cost because implementation of a new tool is avoided.

The method of the present invention is not limited to filling STI features and may also be applied to other CVD processes such as depositing dielectric materials in interconnect applications where an insulating material is required between metal wiring. In this case the CVD process temperature may be reduced to a range between 350° C. and 430° C.

While this invention has been particularly shown and described with reference to, the preferred embodiments thereof, it will be understood by those skilled in the art that various changes in form and details may be made without departing from the spirit and scope of this invention.

We claim:

1. A method of filling an opening or trench in a substrate with a dielectric layer comprising:

providing a substrate in which an opening or trench has been formed, said opening or trench having a bottom, a top, and a width;

performing a first deposition of a dielectric material to form a the dielectric layer on the substrate in a HDP CVD process chamber with a gas mixture comprising oxygen but not argon or other inert gases, said dielectric layer has a first thickness above said opening or trench and said dielectric layer entirely fills said opening or trench;

performing a sputter etch in a HDP CVD process chamber to lower a level of said dielectric layer such that there is no dielectric material remaining above any keyholes in said dielectric layer;

performing a second deposition of said dielectric material in a HDP CVD process chamber without argon to provide a dielectric layer with a second thickness above said opening or trench that ensures said trench or opening is completely filled; and planarizing the dielectric layer until it is coplanar with the top of said opening or trench.

2. The method of claim 1 wherein the width of said opening or trench can vary from below 0.13 micron to 0.25 micron or greater.

3. The method of claim 1 wherein a top layer of said substrate is comprised of silicon nitride, silicon oxynitride, or silicon oxide.

4. The method of claim 1 wherein said first deposition step and said sputter etch step are performed in the same HDP CVD process chamber.

5. The method of claim 1 wherein the first deposition step forms the dielectric layer with no voids near the bottom of said trench.

6. The method of claim 1 wherein silane and oxygen are used for the first deposition step to deposit a layer of silicon dioxide.

7. The method of claim 6 wherein the first deposition is comprised of a silane flow rate between 30 sccm and 110 sccm, an oxygen flow rate between 50 and 220 sccm, a pressure of $\leq 3$ mTorr, a HF RF power between 1500 W and 3500 W, a LF RF power between 1500 W to 7000 W and a temperature from 550° C. to 650° C.

8. The method of claim 1 wherein said sputter etch step is comprised of an argon flow rate between about 70 sccm and 150 sccm, a HF RF power between 1500 W and 3500 W, a LF RF power between 1500 W and 7000 W, a chamber pressure from about 2 to 5 mTorr, and an etch time from about 15 to 40 seconds.

9. The method of claim 1 wherein said sputter etch step is comprised of an oxygen flow rate between about 70 sccm and 250 sccm, a HF RF power between 1500 W and 3500 W, a LF RF power between 1500 W and 7000 W, a chamber pressure from about 2 to 5 mTorr, and an etch time from about 15 to 50 seconds.

10. The method of claim 1 wherein said sputter etch step is comprised of an argon flow rate from about 50 sccm to 120 sccm, an oxygen flow rate from about 50 sccm to 220 sccm, a HF RF power between 1500 W and 3500 W, a LF RF power between 1500 W and 7000 W, and a pressure of about 2 to 5 mTorr.

11. The method of claim 1 further comprised of other openings or trenches in said substrate wherein the width between said openings or trenches varies from about 0.1 micron to more than 1 micron.

12. The method of claim 1 wherein dense arrays of trenches and isolated trenches are formed in the same substrate and are filled simultaneously with the dielectric layer.

13. The method of claim 1 wherein the thickness of said dielectric layer after the second deposition is from about 6000 Angstroms to 10000 Angstroms.

14. A method of forming an STI structure comprising:
providing a substrate in which a shallow trench has been formed, said shallow trench having a bottom, a top, and a width;
performing a first deposition of a dielectric material to form a dielectric layer on the substrate in a HDP CVD process chamber without argon gas or other inert gases as part of a gas mixture used for the first deposition, said dielectric layer has a first thickness above said shallow trench and said dielectric layer entirely fills said openings or trench;
performing a sputter etch in a HDP CVD process chamber to lower the level of said dielectric layer such that there is no dielectric material remaining above any keyholes in said dielectric layer;
performing a second deposition of the dielectric material in a HDP CVD process chamber without argon to provide a dielectric layer with a second thickness above said shallow trench that ensures said shallow trench is completely filled; and
planarizing the dielectric layer until it is coplanar with the top of said shallow trench.

15. The method of claim 14 wherein the width of said shallow trench can vary from below 0.13 micron to 0.25 micron or greater.

16. The method of claim 14 wherein the height of said shallow trench has a maximum value of about 6000 Angstroms.

17. The method of claim 14 wherein a top layer of said substrate is comprised of silicon nitride with a thickness between about 1600 Angstroms and 2000 Angstroms.

18. The method of claim 17 further comprising a pad oxide layer having a thickness between about 50 Angstroms and 200 Angstroms under said silicon nitride layer.

19. The method of claim 14 further comprising a layer of thermal oxide liner in said shallow trench having a thickness between about 50 Angstroms and 250 Angstroms.

20. The method of claim 14 wherein said first deposition step and said sputter etch step are performed in the same HDP CVD process chamber.

21. The method of claim 14 wherein the first deposition step forms the dielectric layer with no voids near the bottom of said shallow trench.

22. The method of claim 14 wherein silane and oxygen are used for the first deposition step to deposit a layer of silicon dioxide.

23. The method of claim 22 wherein the first deposition is comprised of a silane flow rate between 30 sccm and 110 sccm, an oxygen flow rate between 50 and 220 sccm, a pressure of $\leq 3$ mTorr, a HF RF power between 1500 W and 3500 W, a LF RF power between 1500 W to 7000 W and a temperature from 550° C. to 650° C.

24. The method of claim 14 wherein said sputter etch step is comprised of an argon flow rate between about 70 sccm and 150 sccm, a HF RF power between 1500 W and 3500 W, a LF RF power between 1500 W and 7000 W, a chamber pressure from about 2 to 5 mTorr, and an etch time from about 15 to 40 seconds.

25. The method of claim 14 wherein oxygen plasma is used for said sputter etch step and the oxygen flow rate is between 70 sccm and 250 sccm, the HF RF power is between 1500 W and 3500 W, the LF RF power is between 1500 W and 7000 W, the chamber pressure is from 2 to 5 mTorr, and etch time is from 15 to 50 seconds.

26. The method of claim 14 wherein said sputter etch step is comprised of an argon flow rate from about 50 sccm to 120 sccm, an oxygen flow rate from about 50 sccm to 220 sccm, a HF RF power between 1500 W and 3500 W, a LF RF power between 1500 W and 7000 W, and a pressure of about 2 to 5 mTorr.

27. The method of claim 14 further comprised of additional shallow trenches in said substrate wherein the width between said shallow trenches varies from about 0.1 micron to more than 1 micron.

28. The method of claim 14 wherein dense arrays of shallow trenches and isolated shallow trenches are formed in the same substrate and are filled simultaneously with the dielectric layer.

29. The method of claim 14 wherein the thickness of said dielectric layer after the second deposition is between about 6000 Angstroms and 10000 Angstroms.

* * * * *